United States Patent
Moloney et al.

[11] Patent Number: 6,130,903
[45] Date of Patent: Oct. 10, 2000

[54] TRUMPET-FLARED MONOLITHICALLY INTEGRATED SEMICONDUCTOR LASER AMPLIFIER

[75] Inventors: Jerome V. Moloney; Robert Indik, both of Tucson, Ariz.; Cun-Zheng Ning, San Jose, Calif.; Peter Matths Wippel Skovgaard; John G. McInerney, both of Cork, Ireland

[73] Assignee: The Arizona Board of Regents on behalf of the University of Arizona, Tucson, Ariz.

[21] Appl. No.: 09/019,976

[22] Filed: Feb. 6, 1998

Related U.S. Application Data
[60] Provisional application No. 60/037,850, Feb. 7, 1997.

[51] Int. Cl.$^7$ ........................................................ H01S 3/19
[52] U.S. Cl. .............................. 372/46; 372/50; 359/244
[58] Field of Search .................................. 372/45–50, 96, 372/102, 29, 31; 359/342, 344

[56] References Cited

U.S. PATENT DOCUMENTS

| | | | |
|---|---|---|---|
| 5,392,308 | 2/1995 | Welch et al. | 372/50 |
| 5,539,571 | 7/1996 | Welch et al. | 359/344 |
| 5,602,864 | 2/1997 | Welch | 372/50 |
| 5,657,339 | 8/1997 | Fukunaga | 372/50 |
| 5,715,268 | 2/1998 | Lang et al. | 372/50 |

OTHER PUBLICATIONS

J.V. Moloney et al., "Full Space–Time Simulation for High–Brightness SemiconductoR Lasers," IEEE Photonics Technology Letters, vol. 9, No. 6, pp. 731–733, Jun. 1997.

P.M.W. Skovgaard et al., "Enhanced Stability of MFA–MOPA Semiconductor Laser Using a Nonlinear, Trumpet–Shaped Flare," IEEE Photonics Technolgy Letters, vol. 9, No. 9, pp. 1220–1222, Sep. 1997.

C.Z. Ning et al., "Effective Bloch Equations for Semiconductor Lasers and Amplifiers," IEEE Journal of Quantum Electronics, vol. 33, No. 9, pp. 1543–1550, Sep. 1997.

Haug, H. and S. W. Koch, "Quantum Theory of the Optical and Electronic Properties of Semiconductors," World Scientific, Third Edition, 1994.

S. Hughes et al., "The Influence of Electron–Hole Scattering on the Gain Spectra and the Saturation Behavior of Highly Excited Semiconductors," Solid State Communications, vol. 100, No. 555, pp. 1–12, 1996.

W.W. Chow et al., "Comparison of Experimental and Theoretical GaInP Quantum Well Gain Spectra," Appl. Phys. Lett., vol. 71, No. 157, pp. 157–159, 1997.

O'Brien, et al., "Operating Characteristics of a High–Power Monolithically Integrated Flared Amplifier Master Oscillator Power Amplifier," IEEE Journal of Quantum Electronics, pp. 2052–2057 (1993).

*Primary Examiner*—Hemang Sanghavi
*Attorney, Agent, or Firm*—Antonio R. Durando

[57] ABSTRACT

An MFA-MOPA that includes a semiconductor laser with separate master oscillator and trumpet-flared power amplifier regions. Within the trumpet-flared active gain region of the uniformly-pumped power amplifier of the MFA-MOPA device, the density distribution of carriers and reflections of the laser beam are analyzed to determine the output powers at which filamentation and beam degradation due to reflections occur. The shape of the trumpet-flare is optimized to delay the onset of filamentation and the degradation of the output laser beam due to reflections to higher output powers for the MFA-MOPA device.

14 Claims, 9 Drawing Sheets

TRUMPET-FLARED MONOLITHICALLY INTEGRATED SEMICONDUCTOR LASER AMPLIFIER

RELATED APPLICATIONS

This application is based on Provisional Application Ser. No. 60/037,850, filed by the same inventors on Feb. 7, 1997.

U.S. GOVERNMENT RIGHTS

This invention was made with Federal Government support under contract number AFOSR F 49620-94-1-0144 DEF awarded by the Office of Scientific Research of the U.S. Air Force. The Government has certain rights in the invention.

BACKGROUND OF THE INVENTION

1. Field of the Invention

This invention relates to monolithically integrated semiconductor laser amplifiers and to Master Oscillator-Power Amplifier (MOPA) lasers that have a flared amplifier section (such as MFA-MOPA's). In particular, the invention relates to the optimization of the flare of such amplifiers and MOPA devices to achieve higher output powers.

2. Description of the Related Art

Monolithically integrated semiconductor lasers that have a flared amplifier section are well known and have been extensively studied. For example O'Brien, et al., in IEEE Journal of Quantum Electronics, pages 2052–2057 (1993), study the optical properties of a MFA-MOPA semiconductor laser. This design has allowed higher output powers to be achieved in a single diffraction-limited beam. The paper includes a study of output power, efficiency, spectral quality, virtual source stability (astigmatism), and beam quality.

In U.S. Pat. No. 5,602,864, Welch et al. describe a number of semiconductor laser configurations incorporating a flared amplifier section. The semiconductor active medium is an electrically pumped light amplifying diode heterostructure or "amplifier chip" that has a flared gain region with a narrow, single mode, optical aperture end and a broad light output end. The flared gain region is differentially pumped to ensure high power amplification of forward propagating light while maintaining a single spatial mode of oscillation. The flared region is linearly flared and increases in width toward the output facet of the amplifier chip at a rate that is slightly greater than the divergence of light propagating within the flared gain region.

In U.S. Pat. No. 5,539,571, Welch et al. describe an optical amplifier which is differentially pumped. The differential pumping is applied to a semiconductor amplifier which has a gain region that increases in width toward its output at a rate that equals or exceeds the divergence of the light propagating within the amplifier. Because of the flare, the amplifier is pumped with a reduced current density at its input end relative to its output end. The optical signal is amplified along the length of the flared amplifier such that the peak intensity remains nearly constant and the increase in power is a result of the expanding mode width of the amplifier. By having a low current density at the input end, the injected light beam is first allowed to diverge in the amplifier before receiving strong amplification in the more heavily pumped output region of the amplifier. Hot spots near the input end, which otherwise distort the beam and lead to optical filamentation and a spatially incoherent and multimode output, are thus avoided by providing only a low level of pumping near the input end. Also, by only allowing strong amplification at the output end of the amplifier, spatial hole burning in the input region is avoided. The flare of the pumped gain region of the amplifier is typically linear.

In summary, inventors have clearly demonstrated the benefits of a semiconductor laser amplifier which has a linearly-flared gain region, expanding in width from the input end to the output end of the amplifier. Improvements to the flared configuration have been achieved by differentially pumping the gain region.

However, the output power of the flared semiconductor laser is still limited by the onset of filamentation within the amplifier and the consequential degradation of the laser beam. Accordingly, there is still a need for an optimal approach to the design of laser amplifiers to maximize output power without filamentation within the amplifier.

BRIEF SUMMARY OF THE INVENTION

In addition to the objects and advantages of the semiconductor lasers having a linearly-flared amplifier region described in the above inventions, one of the objectives and advantages of the present invention is to provide a semiconductor laser amplifier that maintains a stable, nearly diffraction limited output beam at higher powers before the onset of transverse mode instabilities, excess beam divergence and catastrophic optical damage, thereby enabling the laser to emit an output beam of significantly higher power and brightness than enabled in the prior art.

Another objective is to provide a MOPA device incorporating such an optical amplifier.

Further goals and advantages of the invention are to provide a uniformly pumped semiconductor laser incorporating a flared amplifier region, the shape of the flare having been optimized according to the particular application and the semiconductor material from which the laser is fabricated.

In accordance with the present invention, the MFA-MOPA comprises a semiconductor laser with separate master oscillator and uniformly-pumped trumpet-flared power amplifier regions. Within the trumpet-flared active gain region of the power amplifier of the MFA-MOPA device, the current densities and reflections of the laser beam are analyzed to determine the output powers at which filamentation and beam degradation due to reflections occur. The shape of the trumpet-flare is optimized to delay the onset of filamentation and the degradation of the output laser beam due to reflections to higher output powers for the MFA-MOPA device.

Various other purposes and advantages of the invention will become clear from its description in the specification that follows. Therefore, to the accomplishment of the objectives described above, this invention consists of the features hereinafter illustrated in the drawings and fully described in the detailed description of the preferred embodiment and particularly pointed out in the claims. However, such drawings and description disclose but some of the various ways in which the invention may be practiced.

DESCRIPTION OF THE PREFERRED EMBODIMENTS OF THE INVENTION

Figure 1A:
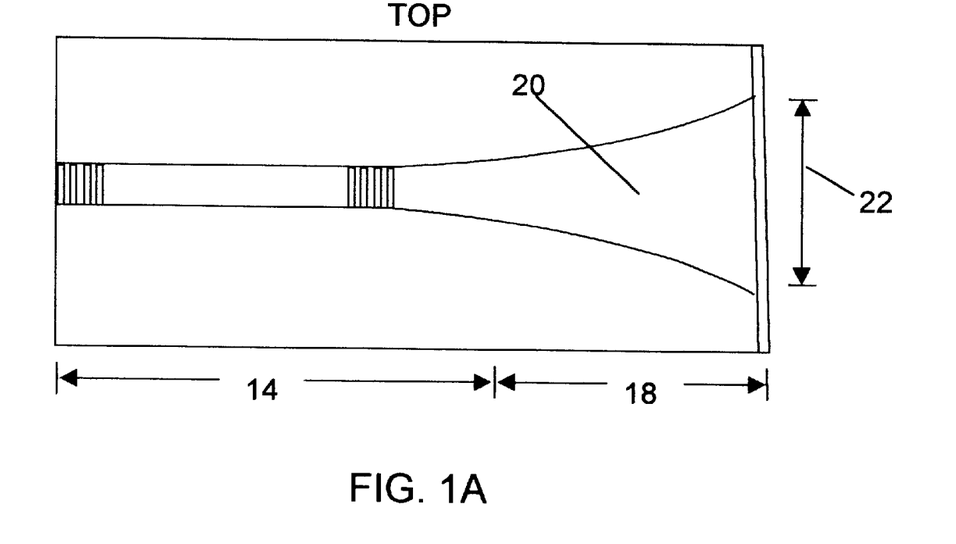
FIGS. 1A and 1B shows a typical MFA MOPA embodiment of the present invention with separate oscillator and amplifier contacts in top and side views, respectively.
Figure 1B:
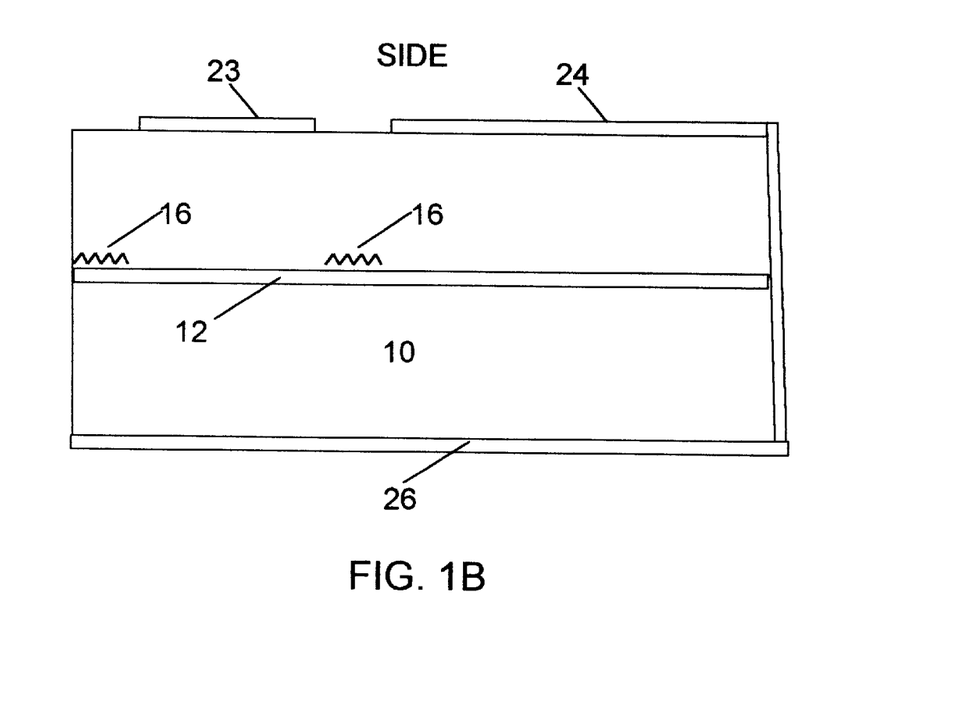

With reference to FIGS. 1A and 1B, an MFA-MOPA semiconductor laser, in accord with one embodiment of the present invention, consists of a master oscillator 14, such as a distributed Bragg reflector (DBR), coupled to a trumpet-flared power amplifier 18, all formed on a common substrate 12 and with electrodes 23, 24 and 26 provided on the top and bottom surfaces of the body. Typically, the material composition is some combination of group III-IV compound semiconductors, such as GaAs/AlGaAs, InGaAs/AlGaAs or InP/InGaAsP. However, other direct bandgap semiconductor materials may also be used. The semiconductor material body can be formed with a homostructure, single heterostructure or, preferably, a double heterostructure or multi-heterostructure. All such structures include an active light emitting region 12 near a pn junction in the body. This active region 12 may be a single active layer, a single quantum well (SQW) structure or a multiple quantum well (MQW) structure. Strained-layer superlattice structures may be used. The electrodes 23, 24 and 26 provide a forward electrical bias across the pn junction and inject currents $I_{MO}$ and $I_{PA}$ through the active region 12 of the master oscillator 14 and power amplifier 18 areas respectively of the MOPA device. Thus, a pump current greater than a lasing threshold current density injected through the active region 12 in the gain section of the MOPA causes lightwaves to be generated in the master oscillator section and to propagate under lasing conditions. The active region 12 and the layers above and below it form a transverse waveguide for light propagation. The term "transverse" is used here to refer to the direction perpendicular to the plane of the active region 12. Lateral waveguiding is also provided in portions of the MOPA device described below. The term "lateral" or "x" refers to the direction in the plane of the active region perpendicular to the direction of propagation. The direction of laser light propagation itself is referred to as the "longitudinal" or "z" direction.

The diode laser oscillator 14 is preferably a distributed Bragg reflector (DBR) laser defined by first or second order DBR gratings 16 bounding the pumped region of the master oscillator. An additional preamplifier and second set of DBR gratings can be added between the master oscillator 14 and the power amplifier 18 to allow for adjustment of the input power to the amplifier independent from the adjustment of the output power of the master oscillator.

A flared power amplifier 18 is coupled to the master oscillator 14. As well understood in the art, gratings at the input aperture and antireflective coating at the output aperture of the amplifier are provided and designed to prevent self-oscillation. In the MOPA device of the present invention the flare of the power amplifier 18 is a non-linear flare referred to as a "trumpet-flare." The amplifier 18 has a transverse waveguiding region 20 with an active light emitting gain region 12 sandwiched between adjacent, higher bandgap, lower refractive index layers above and below the active region 12. The amplifier 18 is electrically pumped with a uniform amplification current $I_{PA}$ through contacts 24 and 26. The width of the top conductive contact 24 above the amplifier 18, and consequently the width of the gain region, is flared such that it has a first width at the input end of the amplifier 18 that substantially matches the width of the output of the master oscillator 14 and a second width at the output end of the amplifier 18 that is significantly wider than the first width. Typically, the increase in width in the amplifier's pumped gain region 20 of amplifier 18 defined by the contact 24 or other waveguiding means matches or is only slightly larger than the divergence of the light beam received from the master oscillator 14. The output of the power amplifier 18 passes through an output facet 22 which is antireflection (AR) coated.

The shape of the flare of the gain region of amplifier 18 illustrated in FIG. 1A is carefully chosen to allow higher output powers from the amplifier 18 before the onset of transverse beam instabilities and filamentation. At the same time, the trumpet-flared gain region of amplifier 18, when optimized to delay the onset of filamentation, also results in a reduced amount of optical feedback from the output of the power amplifier 18 to the master oscillator 14, thereby allowing higher output powers before the onset of reflection-induced intensity and phase fluctuations. As those skilled in the art would readily recognize, the optimum shape of the flare of the gain region of amplifier 18 is dependent upon the geometry of the amplifier as well as the semiconductor material of the substrate 12.

The shape of the flared gain region of amplifier 18 is optimized for an MFA-MOPA embodiment according to the present invention by using a high resolution computational model developed for this purpose (see J. V. Moloney et al., "Full Space-Time Simulation for High-Brightness Semiconductor Lasers," IEEE Photonics Technology Letters, Vol. 9, No. 6, pp. 731–733, June 1997; P. M. W. Skovgaard et al., "Enhanced Stability of MFA-MOPA Semiconductor Laser Using a Nonlinear, Trumpet-Shaped Flare," IEEE Photonics Technology Letters, Vol. 9, No. 9, pp. 1220–1222, September 1997; and C. Z. Ning et al., "Effective Bloch Equations for Semiconductor Lasers and Amplifiers," IEEE Journal of Quantum Electronics, Vol. 33, No. 9, pp. 1543–1550, September 1997). The model resolves time and longitudinal and transverse space dependencies and includes realistic gain and dispersion dynamics. The essence of the model is the extraction of the local refractive index and gain spectra from the complex susceptibility function $\chi(N,\omega)$ of the photon energy $\hbar\omega$ and of the carrier density N. $\chi(N,\omega)$ is normally calculated using a detailed microscopic theory of highly excited semiconductors but may also be obtained directly from experimental data; it is fitted to a number of Lorentzians to give a detailed yet computationally tractable picture of the material response. Nonlinear (saturable) gain and the influence of many-body effects (such as carrier-carrier and carrier-lattice scattering and bandgap renormalization) can be included in the calculation of $\chi(N,\omega)$ for bulk and quantum-well materials.

The forward and backward propagating field amplitudes $E^+$ and $E^+$ as well as the carrier density, are calculated using the following equations:

$$\pm \frac{\partial E^{\pm}}{\partial z} - \frac{i}{2K} \frac{\partial^2 E^{\pm}}{\partial x^2} + \frac{n_g}{c} \frac{\partial E^{\pm}}{\partial t} = \frac{iK}{2\epsilon_0 \epsilon_b} \cdot P_{tot}^{\pm} - \varepsilon(z)(E^+ + E^-) + i\kappa(z)E^{\mp} - \frac{\alpha_{int}}{2} E^{\pm} \quad (1)$$

-continued $$\frac{dN}{dt} - D_N \frac{\partial^2 N}{\partial x^2} =$$
$$-\gamma_1 N + \frac{\eta J}{ew} + \frac{i}{4\hbar}[P_{tot}^{++}E^+ - P_{tot}^+E^{+*} + P_{tot}^{-*}E^- - P_{tot}^-E^{-*}]$$ (2)

where N is the carrier density, $n_g$ and $n_b$ are the group and background refractive indices, $K=\omega_c n_b/c$ is the wavenumber, $\hbar$ is Planck's constant, $\epsilon$ and $\kappa$ denote the surface radiation and the cross-coupling coefficients for the DBR gratings, $\alpha_{int}$ is the linear absorption of the material, and P is the polarization of the material derived from $\chi(N,\omega)$. The symbols $\eta$, J, e, $\omega$ represent respectively the internal quantum efficiency, pumping current density, electron charge, and active region width. $\gamma_1$ and $D_N$ represent the carrier recombination rate and the diffusion length.

$\chi(N,\omega)$ is approximated by the background term plus one or more complex Lorentzian fitted to the gain and index spectra of a 90 Å strained $In_{0.19}Ga_{0.81}As/GaAs$ quantum well, used for here example only. Lattice temperature effects have not been included. Since the width of the amplifier is large, and the current density over this width is constant, lattice temperature effects are expected to play a minor role in the simulations, given that their spatial length scale is much greater than that of filamentation.

The profile width of the flare is defined using the following equation:

$$w(z) = w_0 + (w_{max} - w_0) \cdot \frac{z_{max} - z_0 + b}{(z_{max} - z_0)^2} \cdot \frac{(z - z_0)^2}{z - z_0 + b}$$ (3)

where $w_o$ is the minimum halfwidth of the flare at the input aperture $z_o$ and $w_{max}$ is the (maximum) halfwidth of the flare at the output facet $z_{max}$.

The basis for the optimization of the flare shape lies in the observation that the buildup of unsaturated carriers at the edge of the flared structure, near the master oscillator's pump section end, destabilizes the device and promotes filamentation instabilities which degrade device performance. The strong nonuniformity of carrier density under the flare section changes with current pumping level and depends on the characteristics of the laser gain medium.

The procedure for optimizing the flare geometry is carried out following successive stages. First, the bandstructure evaluated for a specific laser gain medium is used to compute the semiconductor optical response utilizing full microscopic many-body theory, which is well described in the literature (see, for example, Haug, H. and S. W. Koch, "Quantum Theory of the Optical and Electronic Properties of Semiconductors," World Scientific, Third Edition, 1994; S. Hughes et al., "The Influence of Electron-Hole Scattering on the Gain Spectra and the Saturation Behavior of Highly Excited Semiconductors," Solid State Communications, Vol. 100, No. 555, pp. 1–12, 1996; and W. W. Chow et al., "Comparison of Experimental and Theoretical GaInP Quantum Well Gain Spectra," Appl. Phys. Lett., Vol. 71, No. 157, pp. 157–159, 1997). This phase requires specification of the materials making up the gain and barrier regions, their relative composition, stress or strain, Quantum Well thickness, etc., as would be readily understood by those skilled in the art.

The next stage is an iterative procedure. The semiconductor optical response is fed into a laser simulation model, such as the model described by Equations (1) and (2) above, a flare shape is specified and the space-time evolution of the forward/backward intensities and the carrier densities throughout the structure are computed. This information provides a complete profile of the distribution of carriers throughout the active gain region of the amplifier, thereby making it possible for one skilled in the art to identify high density spots likely to produce filamentation. This information enables the judicious modification of the flare geometry so as to reduce pumping where high densities of unsaturated carriers are found, which in turn reduces filamentation in the amplifier. Working at a desired output power level, the flare shape is thus modified iteratively in order to minimize the presence of unsaturated carriers along the edge of the flare. Using Equation (3), the bowing parameter b (as well as other flare parameters, if necessary) is varied and used to generate an updated flare profile, which is then used to compute new carrier density profiles with Equations 1 and 2. An alternative experimental approach would be to utilize a transparent contact (for example an Indium Tin Oxide contact) to obtain images of the spontaneous emission from the active region of the device as a function of the bias current of the power amplifier. This would give information on the carrier density and allow one to iteratively redesign the flare according to the principles of the invention, but this approach would be less reliable because of the inevitable approximation inherent with such visual inference of carrier density.

The results produced by the optimization procedure of the invention, based on examples evaluating both near-field and far-field intensities using typical dimensions and parameters for an MFA-MOPA device and comparing a power amplifier having a linear-flare with a identical power amplifier 18 having the trumpet-flare of the present invention, are shown in FIGS. 2 to 9. These results are for an MFA-MOPA device with $w_{max}=100 \mu m$; $w_o=1 \mu m$ to fit the intensity profile of the light from the master oscillator 14 and a trumpet-flare with a curvature defined by a bowing factor b=4–5 mm. Results are shown for reflectivities of the output facet 22 of 0% and 0.05%.

Figure 2:
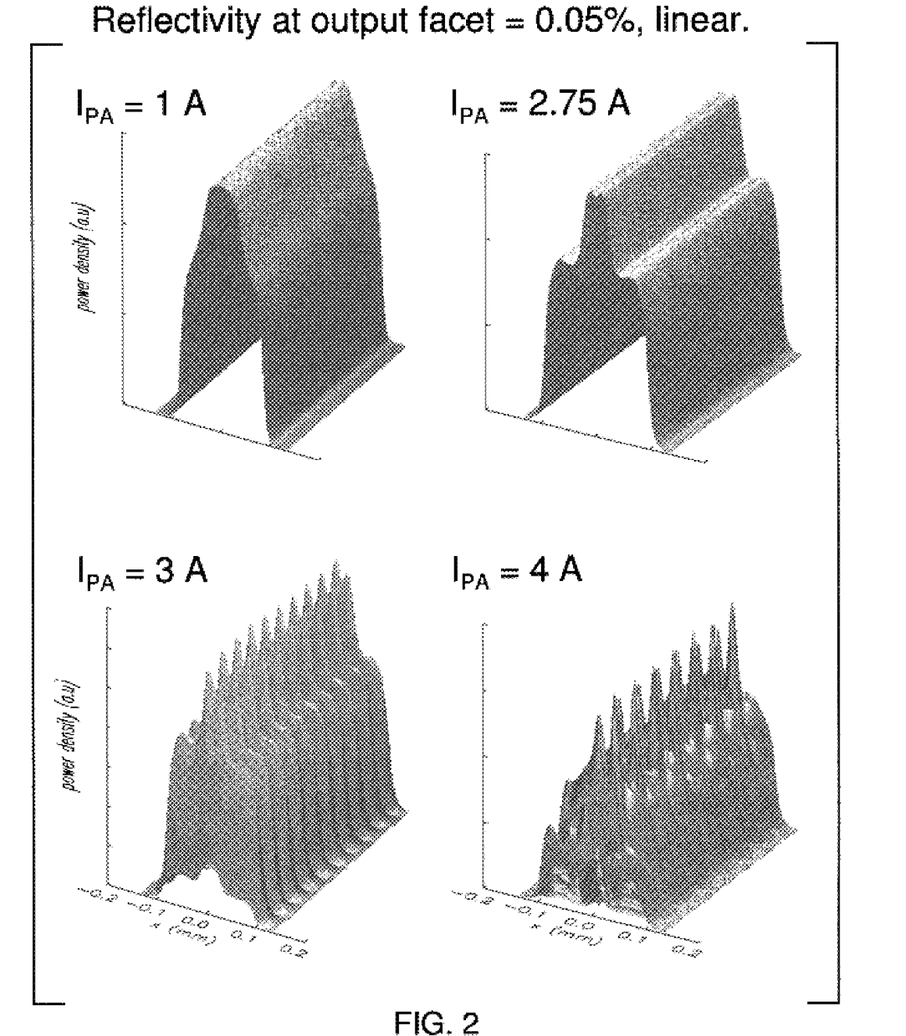
FIG. 2 shows the near-field intensity vs. time and position across the output facet for a linear-flared MOPA. The reflectivity at the output facet is 0.05%.
Figure 3:
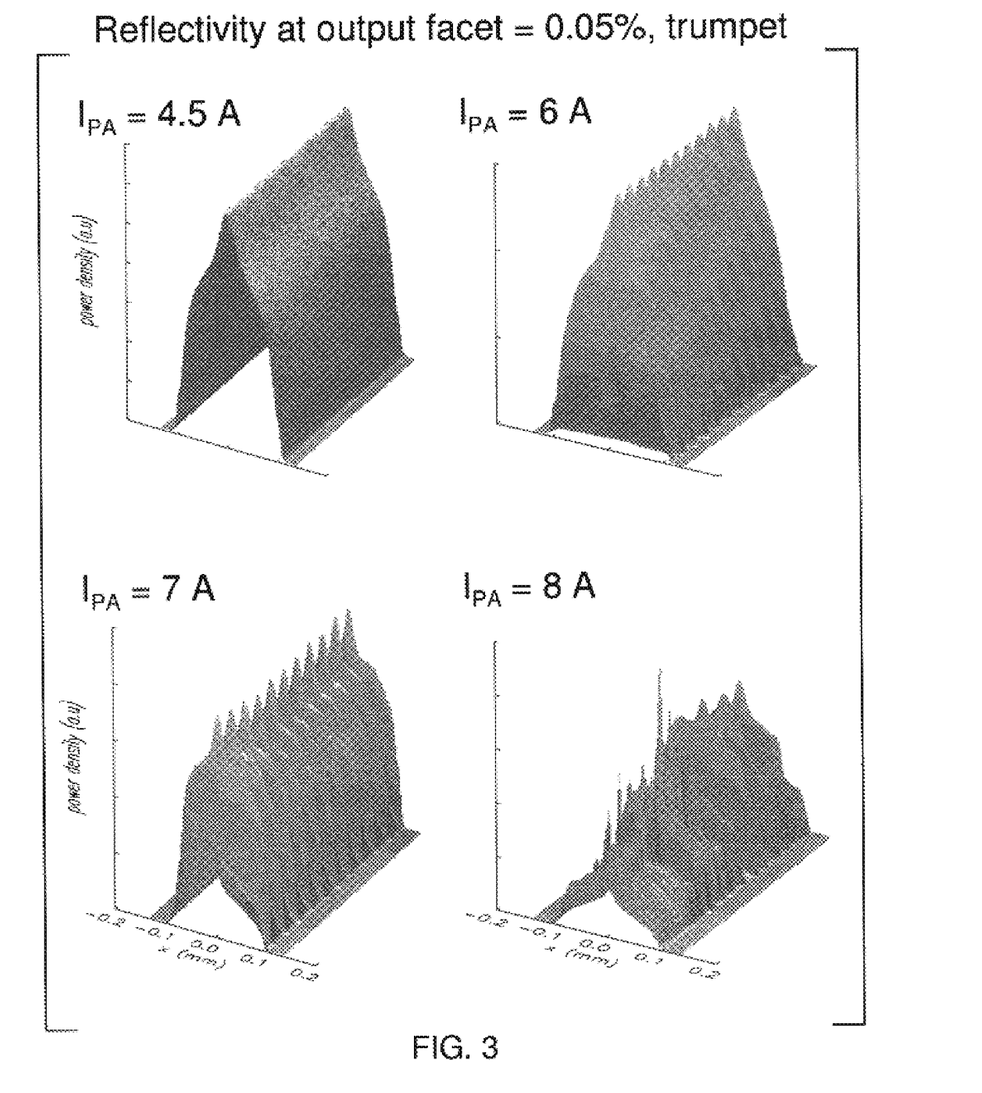
FIG. 3 shows the near-field intensity vs. time and position across the output facet for a trumpet-flared MOPA according to the present invention. The reflectivity at the output facet is 0.05%.

As amplifier current $I_{PA}$ is increased, the MOPA starts to show intensity fluctuations with a frequency corresponding to the optical roundtrip time of the total device. This is shown in FIGS. 2 and 3. These instabilities are due to the amplified backward propagating field reflected off the output facet 22 and entering the master oscillator 14. When the power amplifier drive current $I_{PA}$ is increased further, the onset of transverse instabilities is observed, i.e. the collapse of the beam in the transverse, x, direction into a series of filaments. Such behavior will cause the brightness of the laser to be degraded severely, causing excess beam divergence and local "hot spots" which would damage the output facet 22 of the MOPA. FIGS. 2 and 3 also show that the onset of filamentation occurs when the amplifier drive current $I_{PA}$ exceeds 3 A for a linear-flare and 7 A for the trumpet-flare described above. These drive currents correspond to output powers of 2.3 W and 6.5 W, respectively.

Figure 4:
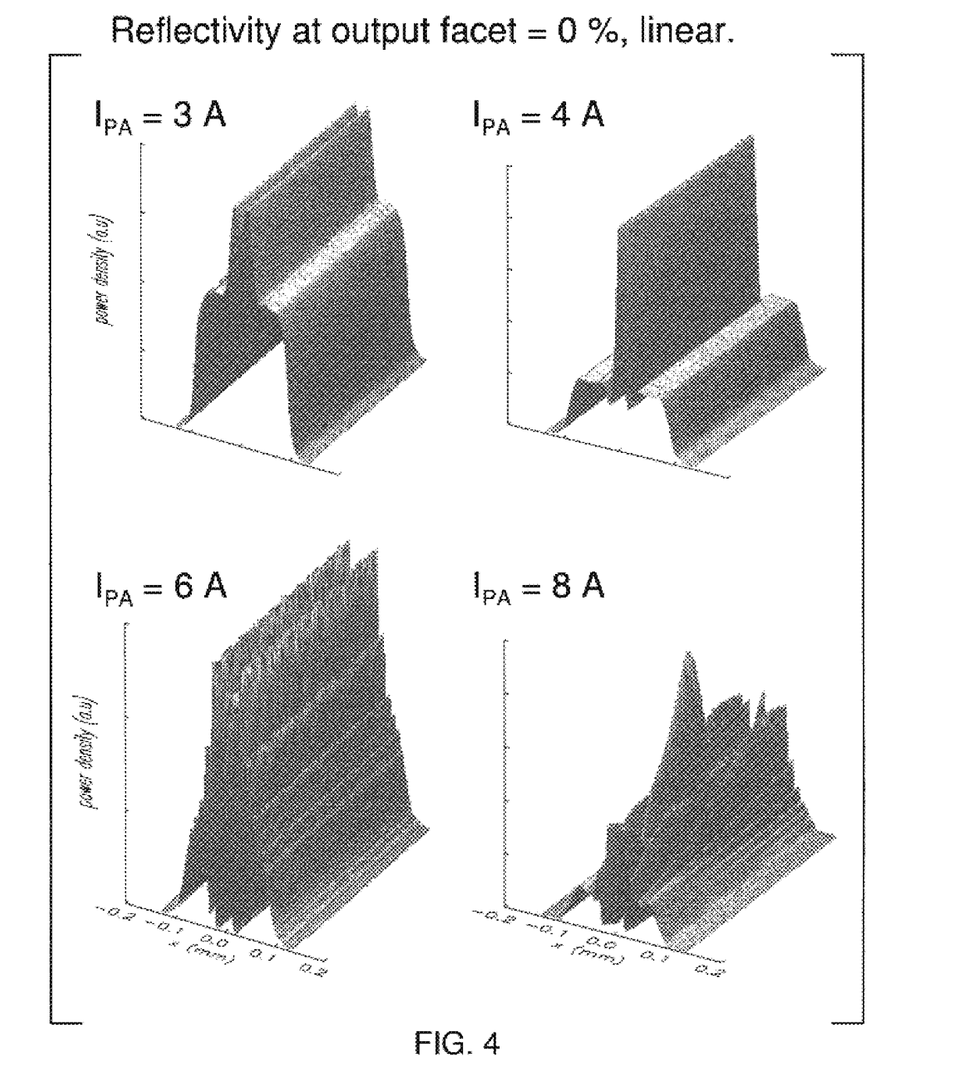
FIG. 4 shows the near-field intensity vs. time and position across the output facet for the linear-flared MOPA. The reflectivity at the output facet is 0%.
Figure 5:
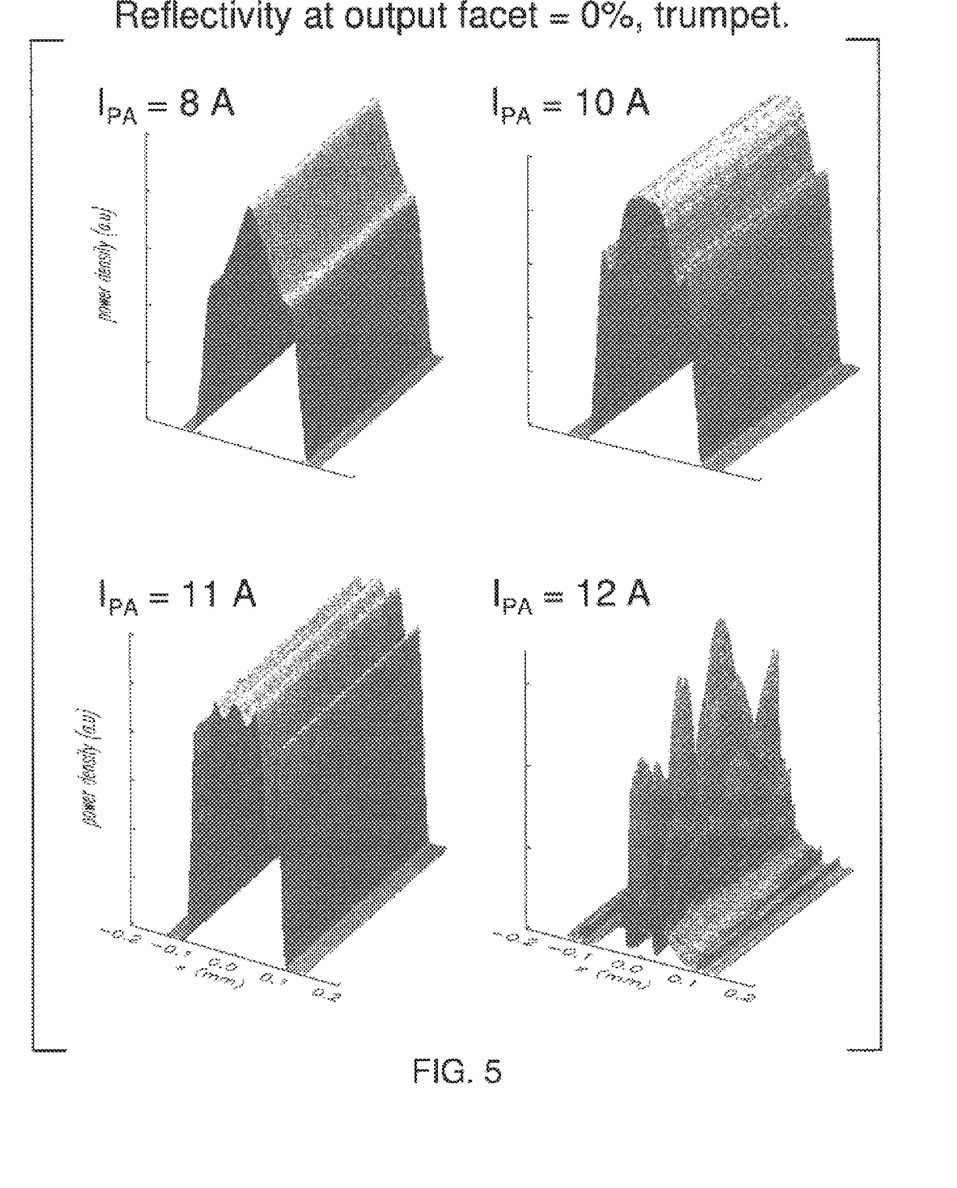
FIG. 5 shows the near-field intensity vs. time and position across the output facet for the trumpet-flared MOPA. The reflectivity at the output facet is 0%.
Figure 6:
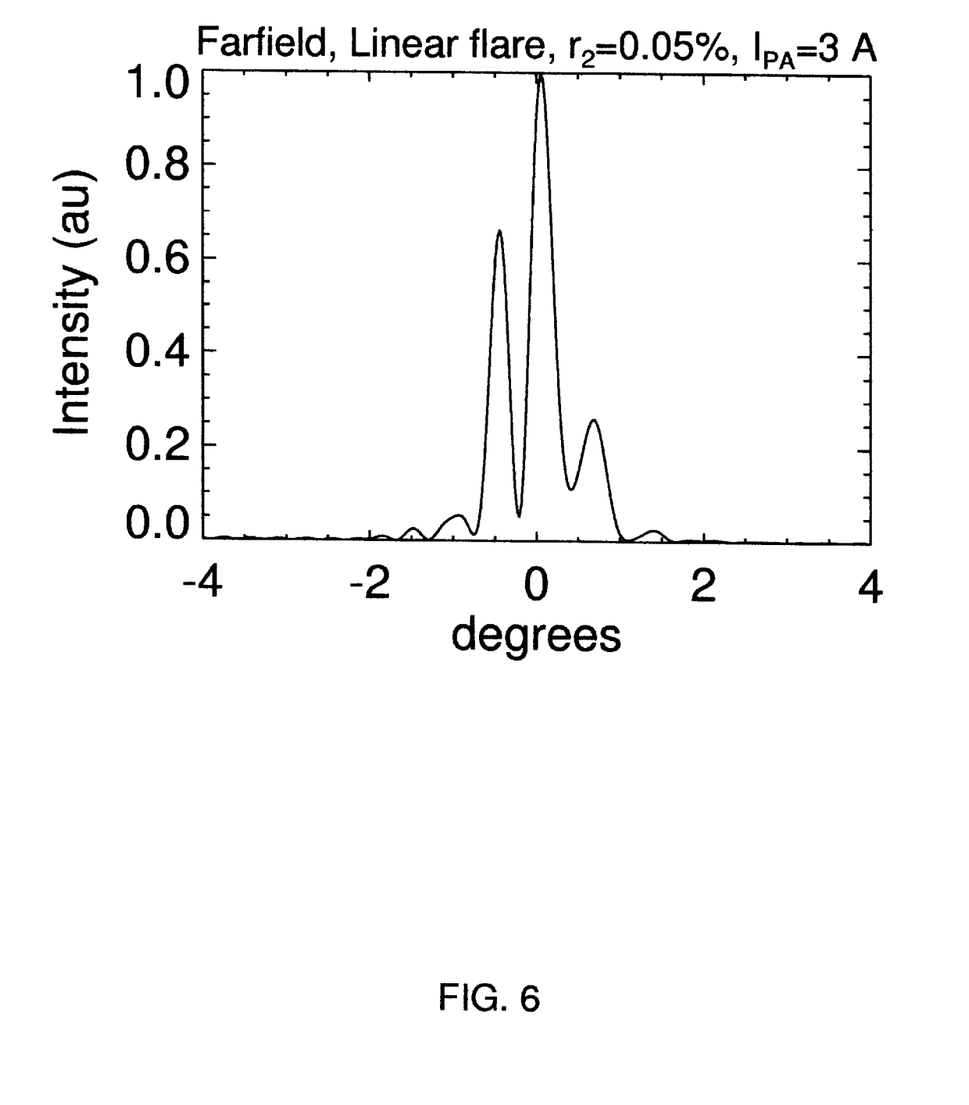
FIGS. 6–9 show the far-fields corresponding to the four cases described in FIGS. 2–5.
Figure 7:
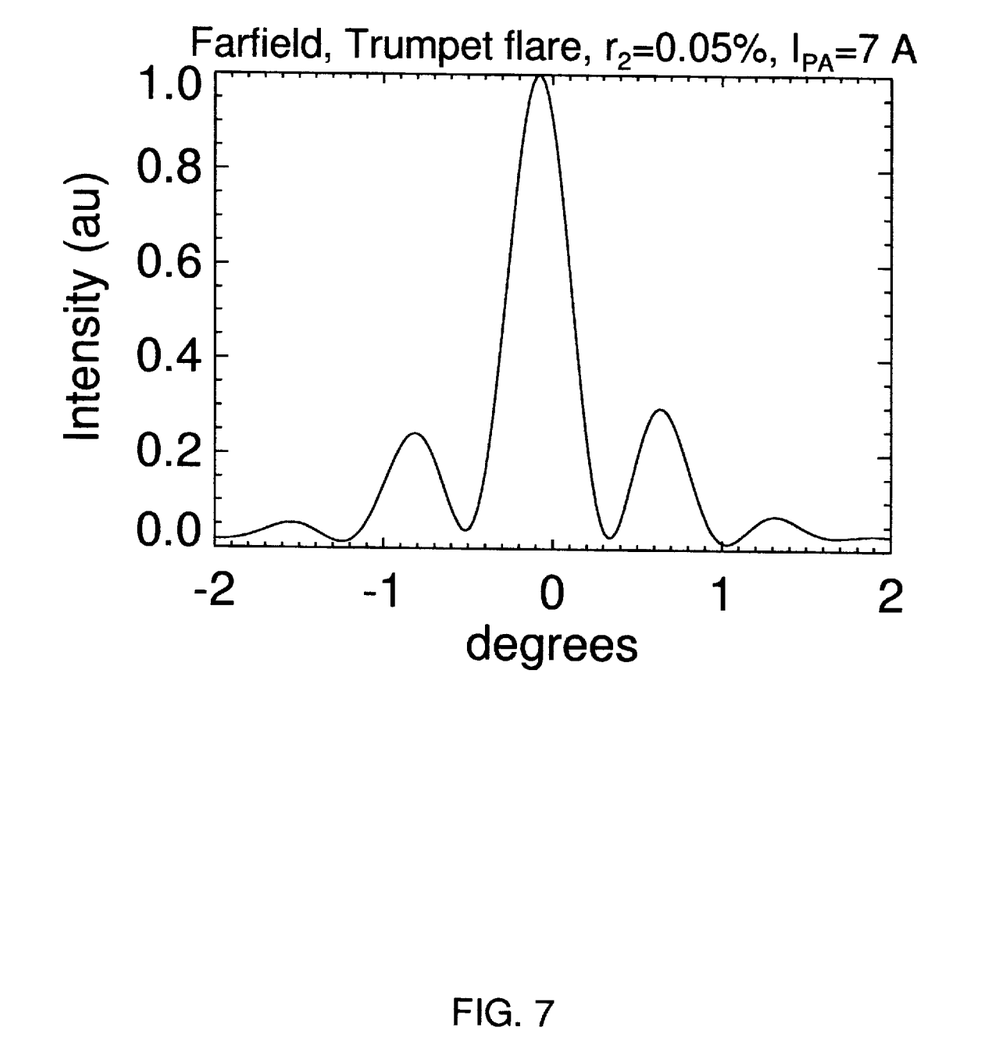
Figure 8:
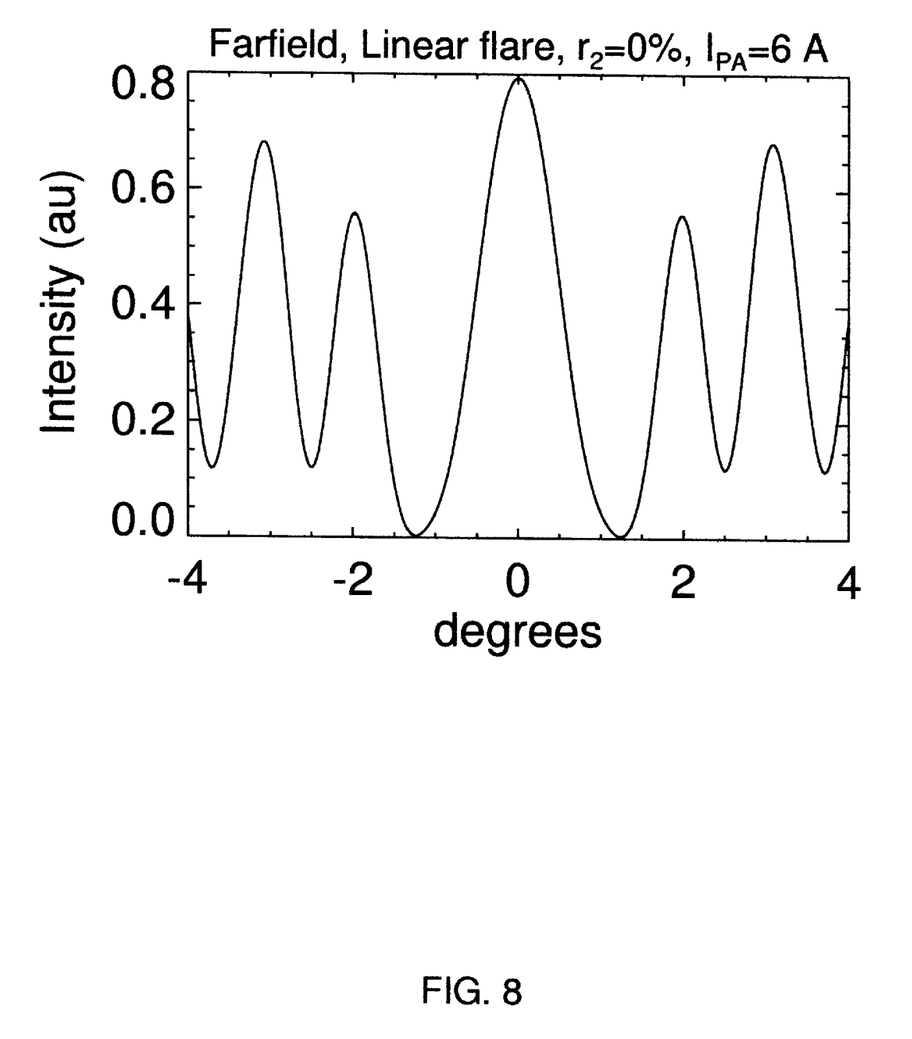
Figure 9:
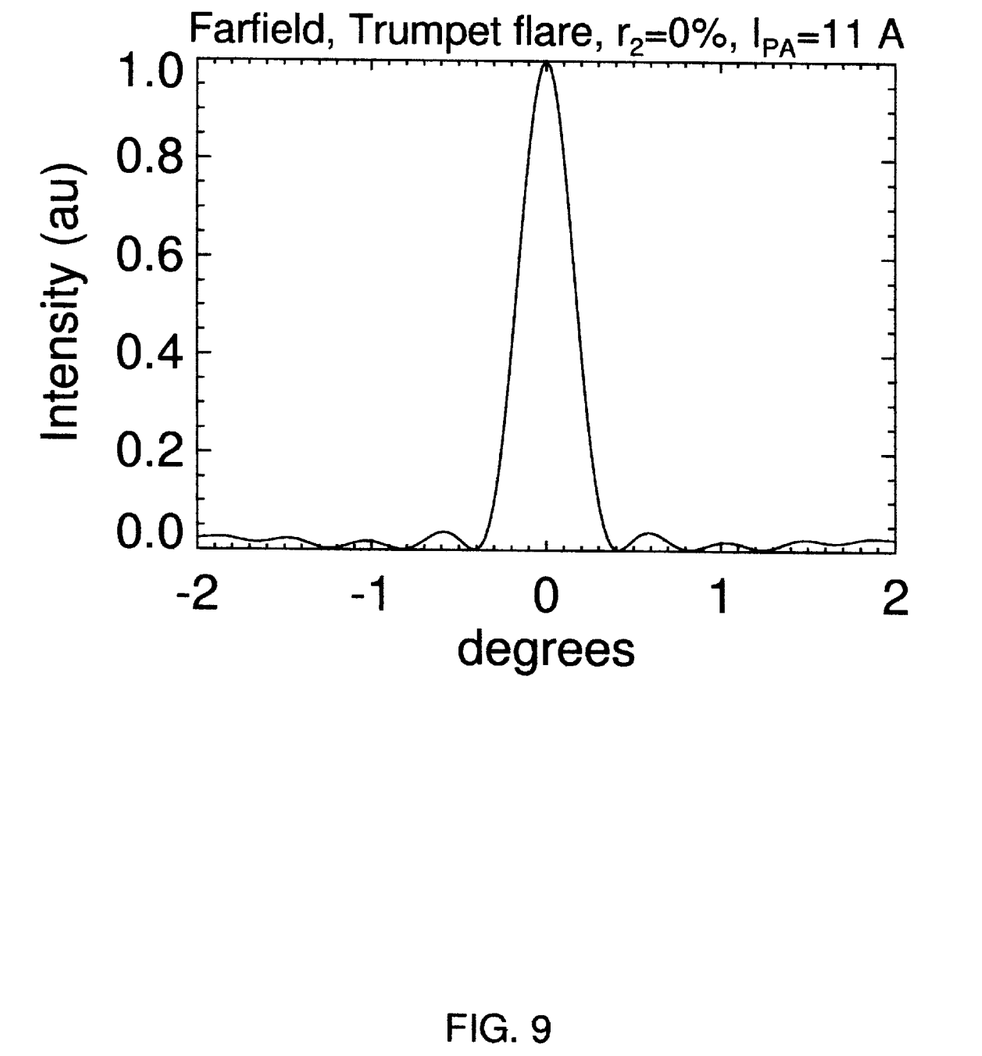

For the ideal case of an output facet 22 with zero reflectivity, there is no optical feedback from the output facet 22 of amplifier 18, so there is no longitudinal mode beating present in the device. Also, the threshold for the onset of filamentation is higher than in the case of finite reflectivity. As the amplifier drive current $I_{PA}$ is increased, there is clear evidence of sharply peaked patterns appearing. These are temporally stable, but at still higher currents we observe the onset of filaments which vary in space and time. FIGS. 4 and 5 show that this occurs when the amplifier drive current $I_{PA}$ exceeds 5 A for the linear-flare and when $I_{PA}$ exceeds 11 A for the trumpet-flare, corresponding to output powers of 4.0 W and 10.7 W, respectively.

An important feature of the MOPA device is that the output is nearly diffraction limited for both the linear-flared and the trumpet-flared amplifier 18, even in the presence of dynamical instabilities, until the onset of filamentation. FIGS. 6 to 9 show the corrected far-field intensities for the four cases described above. A correction has been applied to offset the natural internal divergence of the MOPA output, the correction being equivalent to including a spherical lens in the appropriate location relative to the output facet 22. The central lobe of the far-field has an angular full-width at half-maximum (FWHM) of approximately 0.4° and typically 60% of the power is contained in the central lobe. As an example, for the trumpet-flared MOPA with an output facet reflectivity of 0.05%, 57% of the total output power of 6.6 W is contained within the central lobe with an FWHM of 0.410.

Thus, as illustrated in the drawings, the invention's modification of the flare of the typical MOPA power amplifier 18 from a linear-flare to a trumpet-flare increases the output power for the onset of filamentation in the device by a factor of 2 while maintaining a near diffraction limited output. The method for optimizing the shape of the flare of a flared semiconductor laser amplifier as set forth in this disclosure allows one skilled in the art to design a trumpet-flared MOPA semiconductor laser to produce a maximum useable continuous wave (CW) output power and brightness which is approximately twice that obtainable prior to the improvement of this invention.

Various changes in the details, steps and components that have been described may be made by those skilled in the art within the principles and scope of the invention herein illustrated. For example, the trumpet-flared feature to control the density distribution of carriers within the gain portion of a semiconductor laser amplifier can be applied to an amplifier which is independent of the master oscillator. Further, the methods of this invention may be utilized to design semiconductor flared amplifiers manufactured from a variety of semiconductor materials and different device geometries. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope embraced by any and all equivalent processes and products.

We claim:

1. A method for increasing the output power of a semiconductor laser amplifier comprising an input aperture, an output aperture and an intervening active gain region, comprising the following steps:

(a) computing the semiconductor optical response of the laser amplifier;

(b) selecting an output power for the amplifier;

(c) selecting a flare geometry for the active gain region of the amplifier;

(d) based on the computed semiconductor optical response and the selected output power and flare geometry, computing a corresponding density distribution of carriers in the active gain region of the amplifier;

(e) modifying the flare geometry so as to reduce peak values in the density distribution of carriers; and (f) repeating steps (d) and (e) until a flare geometry is identified that produces a density distribution of unsaturated carriers that prevents filamentation throughout the active gain region at the selected output power.

2. The method of claim 1, wherein step (a) is carried out using full microscopic many-body theory.

3. The method of claim 1, wherein step (d) is carried out using the following model equations:

$$\pm \frac{\partial E^\pm}{\partial z} - \frac{i}{2K} \frac{\partial^2 E^\pm}{\partial x^2} + \frac{n_g}{c} \frac{\partial E^\pm}{\partial t} = \frac{iK}{2\epsilon_0 \epsilon_b} \cdot P_{tot}^\pm - \varepsilon(z)(E^+ + E^-) + i\kappa(z)E^\mp - \frac{\alpha_{int}}{2} E^\pm$$

$$\frac{dN}{dt} - D_N \frac{\partial^2 N}{\partial x^2} = -\gamma_1 N + \frac{\eta J}{ew} + \frac{i}{4\hbar}[P_{tot}^{+*}E^+ - P_{tot}^+ E^{+*} + P_{tot}^{-*}E^- - P_{tot}^- E^{-*}]$$

where $E^+$ and $E^-$ are forward and backward complex electric field amplitudes, respectively; N is carrier density; $K=\omega_c n_b/c$ is the wavenumber; $\hbar$ is Planck's constant; $n_g$ and $n_b$ are group and background refractive indices, respectively; $\epsilon$ and $\kappa$ denote surface radiation and cross-coupling coefficients for the gratings, respectively; $\alpha_{int}$ is the linear absorption of the material; P is the polarization of the material derived from the complex susceptibility function $\chi(N,\omega)$; $\eta$, J, e, $\omega$ represent internal quantum efficiency, pumping current density, electron charge, and active region width, respectively; and $\gamma_1$ and $D_N$ represent carrier recombination rate and diffusion length, respectively.

4. The method of claim 2, wherein step (d) is carried out using the following equations:

$$\pm \frac{\partial E^\pm}{\partial z} - \frac{i}{2K} \frac{\partial^2 E^\pm}{\partial x^2} + \frac{n_g}{c} \frac{\partial E^\pm}{\partial t} = \frac{iK}{2\epsilon_0 \epsilon_b} \cdot P_{tot}^\pm - \varepsilon(z)(E^+ + E^-) + i\kappa(z)E^\mp - \frac{\alpha_{int}}{2} E^\pm$$

$$\frac{dN}{dt} - D_N \frac{\partial^2 N}{\partial x^2} = -\gamma_1 N + \frac{\eta J}{ew} + \frac{i}{4\hbar}[P_{tot}^{+*}E^+ - P_{tot}^+ E^{+*} + P_{tot}^{-*}E^- - P_{tot}^- E^{-*}]$$

where $E^+$ and $E^-$ are forward and backward complex electric field amplitudes, respectively; N is carrier density; $K=\omega_c n_b/c$ is the wavenumber; $\hbar$ is Planck's constant; $n_g$ and $n_b$ are group and background refractive indices, respectively; $\epsilon$ and $\kappa$ denote surface radiation and cross-coupling coefficients for the gratings, respectively; $\alpha_{int}$ is the linear absorption of the material; P is the polarization of the material derived from the complex susceptibility function $\chi(N,\omega)$; $\eta$, J, e, $\omega$ represent internal quantum efficiency, pumping current density, electron charge, and active region width, respectively; and $\gamma_1$ and $D_N$ represent carrier recombination rate and diffusion length, respectively.

5. The method of claim 1, wherein step (e) is carried out using the following equation $$w(z) = w_0 + (w_{max} - w_0) \cdot \frac{z_{max} - z_0 + b}{(z_{max} - z_0)^2} \cdot \frac{(z - z_0)^2}{z - z_0 + b}$$

where b is a bowing parameter, $w_o$ is a minimum halfwidth of the flare geometry at the input aperture $z_o$ and $w_{max}$ is a maximum halfwidth of the flare geometry at the output aperture $z_{max}$.

6. The method of claim 2, wherein step (e) is carried out using the following equation $$w(z) = w_0 + (w_{max} - w_0) \cdot \frac{z_{max} - z_0 + b}{(z_{max} - z_0)^2} \cdot \frac{(z - z_0)^2}{z - z_0 + b}$$

where b is a bowing parameter, $w_o$ is a minimum halfwidth of the flare geometry at the input aperture $z_o$ and $w_{max}$ is a maximum halfwidth of the flare geometry at the output aperture $z_{max}$.

7. The method of claim 4, wherein step (e) is carried out using the following equation $$w(z) = w_0 + (w_{max} - w_0) \cdot \frac{z_{max} - z_0 + b}{(z_{max} - z_0)^2} \cdot \frac{(z - z_0)^2}{z - z_0 + b}$$

where b is a bowing parameter, $w_o$ is a minimum halfwidth of the flare geometry at the input aperture $z_o$ and $w_{max}$ is a maximum halfwidth of the flare geometry at the output aperture $z_{max}$.

8. A method for increasing the output power of a semiconductor MOPA laser amplifier comprising a master oscillator and a power amplifier including an input aperture, an output aperture and an intervening active gain region, comprising the following steps:

(a) computing the semiconductor optical response of the laser amplifier;

(b) selecting an output power for the amplifier;

(c) selecting a flare geometry for the active gain region of the amplifier;

(d) based on the computed semiconductor optical response and the selected output power and flare geometry, computing a corresponding density distribution of carriers in the active gain region of the amplifier;

(e) modifying the flare geometry so as to reduce peak values in the density distribution of carriers; and (f) repeating steps (d) and (e) until a flare geometry is identified that produces a density distribution of unsaturated carriers that prevents filamentation throughout the active gain region at the selected output power.

9. The method of claim 8, wherein step (a) is carried out using full microscopic many-body theory.

10. The method of claim 8, wherein step (d) is carried out using the following model equations:

$$\pm \frac{\partial E^{\pm}}{\partial z} - \frac{i}{2K} \frac{\partial^2 E^{\pm}}{\partial x^2} + \frac{n_g}{c} \frac{\partial E^{\pm}}{\partial t} = \frac{iK}{2\epsilon_0 \epsilon_b} \cdot P_{tot}^{\pm} - \varepsilon(z)(E^+ + E^-) + i\kappa(z)E^{\mp} - \frac{\alpha_{int}}{2} E^{\pm}$$

$$\frac{dN}{dt} - D_N \frac{\partial^2 N}{\partial x^2} = -\gamma_1 N + \frac{\eta J}{ew} + \frac{i}{4\hbar}[P_{tot}^{+*}E^+ - P_{tot}^+ E^{+*} + P_{tot}^{-*}E^- - P_{tot}^- E^{-*}]$$

where $E^+$ and $E^-$ are forward and backward complex electric field amplitudes, respectively; N is carrier density; $K = \omega_c n_b/c$ is the wavenumber; $\hbar$ is Planck's constant; $n_g$ and $n_b$ are group and background refractive indices, respectively; $\epsilon$ and $\kappa$ denote surface radiation and cross-coupling coefficients for the gratings, respectively; $\alpha_{int}$ is the linear absorption of the material; P is the polarization of the material derived from the complex susceptibility function $\chi(N,\omega)$; $\eta$, J, e, $\omega$ represent internal quantum efficiency, pumping current density, electron charge, and active region width, respectively; and $\gamma_1$ and $D_N$ represent carrier recombination rate and diffusion length, respectively.

11. The method of claim 9, wherein step (d) is carried out using the following equations:

$$\pm \frac{\partial E^{\pm}}{\partial z} - \frac{i}{2K} \frac{\partial^2 E^{\pm}}{\partial x^2} + \frac{n_g}{c} \frac{\partial E^{\pm}}{\partial t} = \frac{iK}{2\epsilon_0 \epsilon_b} \cdot P_{tot}^{\pm} - \varepsilon(z)(E^+ + E^-) + i\kappa(z)E^{\mp} - \frac{\alpha_{int}}{2} E^{\pm}$$

$$\frac{dN}{dt} - D_N \frac{\partial^2 N}{\partial x^2} = -\gamma_1 N + \frac{\eta J}{ew} + \frac{i}{4\hbar}[P_{tot}^{+*}E^+ - P_{tot}^+ E^{+*} + P_{tot}^{-*}E^- - P_{tot}^- E^{-*}]$$

where $E^+$ and $E^-$ are forward and backward complex electric field amplitudes, respectively; N is carrier density; $K = \omega_c n_b/c$ is the wavenumber; $\hbar$ is Planck's constant; $n_g$ and $n_b$ are group and background refractive indices, respectively; $\epsilon$ and $\kappa$ denote surface radiation and cross-coupling coefficients for the gratings, respectively; $\alpha_{int}$ is the linear absorption of the material; P is the polarization of the material derived from the complex susceptibility function $\chi(N,\omega)$; $\eta$, J, e, $\omega$ represent internal quantum efficiency, pumping current density, electron charge, and active region width, respectively; and $\gamma_1$ and $D_N$ represent carrier recombination rate and diffusion length, respectively.

12. The method of claim 8, wherein step (e) is carried out using the following equation $$w(z) = w_0 + (w_{max} - w_0) \cdot \frac{z_{max} - z_0 + b}{(z_{max} - z_0)^2} \cdot \frac{(z - z_0)^2}{z - z_0 + b}$$

where b is a bowing parameter, $w_o$ is a minimum halfwidth of the flare geometry at the input aperture $z_o$ and $w_{max}$ is a maximum halfwidth of the flare geometry at the output aperture $z_{max}$.

13. The method of claim 9, wherein step (e) is carried out using the following equation $$w(z) = w_0 + (w_{max} - w_0) \cdot \frac{z_{max} - z_0 + b}{(z_{max} - z_0)^2} \cdot \frac{(z - z_0)^2}{z - z_0 + b}$$

where b is a bowing parameter, $w_o$ is a minimum halfwidth of the flare geometry at the input aperture $z_o$ and $w_{max}$ is a maximum halfwidth of the flare geometry at the output aperture $z_{max}$.

14. The method of claim 11, wherein step (e) is carried out using the following equation $$w(z) = w_0 + (w_{max} - w_0) \cdot \frac{z_{max} - z_0 + b}{(z_{max} - z_0)^2} \cdot \frac{(z - z_0)^2}{z - z_0 + b}$$

where b is a bowing parameter, $w_o$ is a minimum halfwidth of the flare geometry at the input aperture $z_o$ and $w_{max}$ is a maximum halfwidth of the flare geometry at the output aperture $z_{max}$.

* * * * *